(12) United States Patent
Hart et al.

(10) Patent No.: US 9,478,610 B2
(45) Date of Patent: Oct. 25, 2016

(54) TRANSFORMATION OF NANOSTRUCTURE ARRAYS

(75) Inventors: Anastasios John Hart, Ann Arbor, MI (US); Sameh Tawfick, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 575 days.

(21) Appl. No.: 12/629,301

(22) Filed: Dec. 2, 2009

(65) Prior Publication Data
US 2010/0294424 A1    Nov. 25, 2010

Related U.S. Application Data

(60) Provisional application No. 61/119,120, filed on Dec. 2, 2008.

(51) Int. Cl.
| | | |
|---|---|---|
| *H01L 29/06* | (2006.01) | |
| *B82Y 10/00* | (2011.01) | |
| *B82Y 30/00* | (2011.01) | |
| *H01L 51/00* | (2006.01) | |

(52) U.S. Cl.
CPC ........... *H01L 29/0665* (2013.01); *B82Y 10/00* (2013.01); *B82Y 30/00* (2013.01); *H01L 29/0673* (2013.01); *H01L 51/0012* (2013.01); *H01L 51/0048* (2013.01)

(58) Field of Classification Search
CPC .................................................. H01L 29/0665
USPC ........................................................ 264/310
See application file for complete search history.

(56) References Cited

U.S. PATENT DOCUMENTS

| | | | |
|---|---|---|---|
| 7,514,116 B2 | 4/2009 | Natekar et al. | |
| 2007/0152194 A1* | 7/2007 | Natekar et al. | ............... 252/500 |
| 2007/0237959 A1* | 10/2007 | Lemaire | ........................ 428/408 |

OTHER PUBLICATIONS

Flexible High-Conductivity Carbon-Nanotube Interconnects Made by Rolling and Printing, Small Nov. 2009, 5, 2467-2473.*
Chan et al. ("Toppling, flattening, and printing carbon nanotube dominos," Univ. of Michigan, Dec. 2008).*
Wang et al. ("Highly oriented carbon nanotube papers made of aligned carbon nanotubes," Nanotechnology, 19 (2008)).*
Y. Yao et al., "Silicon Microelectrodes with Flexible Integrated Cables for Neural Implant Applications", Proceedings of the 3rd International IEEE EMBS Conference on Neural Engineering, Kohala Coast, Hawaii, USA, May 2-5, 2007, 4 pages.
David J. Anderson et al., "Batch-Fabricated Thin-Film Electrodes for Stimulation of the Central Auditory System", IEEE Transactions on Biomedical Engineering, vol. 36, No. 7, Jul. 1989, 12 pages.

(Continued)

*Primary Examiner* — Larry Thrower
(74) *Attorney, Agent, or Firm* — Reising Ethington P.C.

(57) ABSTRACT

A method and apparatus for transforming vertically-aligned nanostructures into densified, horizontally-aligned arrays. A contact element such as a roller is used to topple an array of carbon nanotubes or other nanostructures by drawing or rolling the contact element across the surface of the substrate such that the vertically-aligned nanostructures are forced into at least partial horizontal-alignment while being densified to give the transformed array enhanced properties. The contact element engages the nanostructures at a location below their upper distal end to topple and densify the array without disrupting the relative alignment of the individual nanostructures in the array. Transfer printing of the nanostructures is also provided.

22 Claims, 13 Drawing Sheets

(56) References Cited

OTHER PUBLICATIONS

Gael F. Close et al., "Fabrication and Characterization of Carbon Nanotube Interconnects", Center for Integrated Systems and Department of Electrical Engineering, Stanford University, 4 pages.

Daisuke Yokoyama et al. "Electrical Properties of Carbon Nanotubes Grown at a Low Temperature for Use as Interconnects", Japanese Journal of Applied Physics, vol. 47, No. 4, 2008, pp. 1985-1990.

Ken R. Atkinson et al., "Multifunctional Carbon Nanotube Yarns and Transparent Sheets: Fabrication, Properties, and Applications", ScienceDirect, www.sciencedirect.com, Physica B 394 (2007) pp. 339-343.

J.E. Fischer et al., "Magnetically Aligned Single Wall Carbon Nanotube Films: Preferred Orientation and Anisotropic Transport Properties", Journal of Applied Physics, vol. 93, No. 4, Feb. 15, 2003, 7 pages.

Azad Naeemi et al., "Performance Benchmarking for Graphene Nanoribbon, Carbon Nanotube, and Cu Interconnects", Georgia Institute of Technology, 3 pages.

Wei Huang et al., "99.9% Purity Multi-Walled Carbon Nanotubes by Vacuum High-Temperature Annealing", Department of Chemical Engineering, Tsinghua University, Beijing 100084, China, Jun. 5, 2003, 6 pages.

Matthew A. Meitl et al., "Transfer Printing by Kinetic Control of Adhesion to an Elastomeric Stamp", Department of Material Science and Engineering, Beckman Institute and Seitz Materials Research Laboratory, University of Illinois at Urbana-Champaign, 6 pages.

Benjamin N. Wang et al., "Quantitative Characterization of the Morphology of Multiwall Carbon Nanotube Films by Small-Angle X-ray Scattering", Departments of Chemical Engineering, Materials Science and Engineering, and Mechanical Engineering, Massachusetts Institute of Technology, Dec. 22, 2006, 7 pages.

Cary L. Pint et al., "Formation of Highly Dense Aligned Ribbons and Transparent Films of Single-Walled Carbon Nanotubes Directly From Carpets", Department of Physics and Astronomy, Department of Chemical and Biomolecular Engineering, Department of Chemistry and Richard E. Smalley Institute for Nanoscale Science and Technology, Rice University, Houston, Texas and Department of Physics, Cornell University, Ithica, New York, vol. 2, No. 9, 2008, pp. 1871-1878.

Anastasios John Hart et al., "Rapid Growth and Flow-Mediated Nucleation of Millimeter-Scale Aligned Carbon Nanotube Structures From a Thin-Film Catalyst", Department of Mechanical Engineering, Massachusetts Institute of Technology, Sep. 27, 2005, American Chemical Society, 2006, 8 pages.

C. Py, et al., "3D Aggregation of Wet Fibers", Physique et Mecanique des Milieux Heterogenes, UMR 7636 CNRS—ESPCI—Paris 6—Paris 7, 10 rue Vanquelin 75005, Paris, France, A Letters Journal Exploring the Frontiers of Physics, Feb. 2007, 5 pages.

Seong Jun Kang et al., "Printed Multilayer Superstructures of Aligned Single-Walled Carbon Nanotubes for Electronic Applications", Nano Letters, 2007, vol. 7, No. 11, American Chemical Society, 2007, pp. 3343-3348.

Aravind Vijayaraghavan et al., "Ultra-Large-Scale Directed Assembly of Single-Walled Carbon Nanotube Devices", Nano Letters, 2007, vol. 7, No. 6, pp. 1556-1560, American Chemical Society, 2007.

Shaoming Huang et al., "Growth of Millimeter-Long and Horizontally Aligned Single-Walled Carbon Nanotubes on Flat Substrates", Chemistry Department, Duke University, Journal of American Chemical Society, 2003, 125, pp. 5636-5637.

Seong Jun Kang et al., "High-Performance Electronics Using Dense, Perfectly Aligned Arrays of Single-Walled Carbon Nanotubes", Mar. 25, 2007, Nature Nantechnology, vol. 2, Apr. 2007, 7 pages.

Bin Zhao et al., "Exploring Advantages of Diverse Carbon Nanotube Forest with Tailored Structures Synthesized by Supergrowth from Engineered Catalysts", Nanotube Research Center and Therma Physical Properties, Section, NMU, National Institute of Advanced Industrial Science and Technology (IST), ACS NANO, vol. 3, No. 1, Oct. 3, 2008, American Chemical Society, 2009, 7 pages.

S. Tawfick et al., "Flexible High-Conductivity Carbon-Nanotube Interconnects Made by Rolling and Printing", Small, 2009, 5, No. 21, pp. 2467-2473.

Anastasios John Hart et al., "Force Output, Control of Film Structure, and Microscale Shape Transfer by Carbon Nanotube Growth Under Mechanical Pressure", Department of Mechanical Engineering, Massachusetts Institute of Technology, Nano Letters, 2006, vol. 6, No. 6, pp. 1254-1260.

Don N. Futaba et al., "Shape-Engineerable and Highly Densely Packed Single-Walled Carbon Nanotubes and Their Application as Super-Capacitor Electrodes", Nature Materials, vol. 5, Dec. 2006, 2006 Nature Publishing Group, 8 pages.

Shoushan Fan et al., "Self-Oriented Regular Arrays of Carbon Nanotubes and Their Field Emission Properties",Science, New Series, vol. 283, No. 5401 (Jan. 22, 1999) American Association for the Advancement of Science, pp. 512-514.

Mingsheng Wang, et al. "Shaping Carbon Nanotubes and the Effects on Their Electrical and Mechanical Properties", Advanced Functional Materials, 2006, 16, pp. 1462-1468.

Azad Naeemi et al., "Performance Comparison Between Carbon Nanotube and Copper Interconnects for Gigascale Integration (GSI)", IEEE Electron Device Letters, vol. 26, No. 2, Feb. 2005, 3 pages.

B. Q. Wei et al. "Reliability and Current Carrying Capacity of Carbon Nanotubes", Applied Physics Letters, vol. 79, No. 8, Aug. 20, 2001, 3 pages.

H.J. Li, et al., "Multichannel Ballistic Transport in Multiwall Carbon Nanotubes", The American Physical Society, 95, 086601, Aug. 19, 2005, 4 pages.

Author unknown, "International Technology Roadmap for Semiconductors", 2007 Edition, Interconnect, 67 pages.

Ray H. Baughman et al., "Carbon Nanotubes: The Route Toward Applications", Science, New Series, vol. 297, No. 5582, (Aug. 2, 2002), American Association for the Advancement of Science, pp. 787-792.

Yuhei Hayamizu et al., "Integrated Three-Dimensional Microelectromechanical Devices from Processable Carbon Nanotube Wafers", Naturenanotechnology, vol. 3, May 2008, 2008 Nature Publishing Group, 6 pages.

Ding Wang et al, "Highly Oriented Carbon Nanotube Papers Made of Aligned Carbon Nanotubes", Tsinghua-Foxconn Nanotechnology Research Center and Department of Physics, Tsinghua University, People's Republic of China, Nantechnology, 19, (2008), 075609, 6 pages.

Kensall D. Wise et al., "Microelectrodes, Microelectronics, and Implantable Neural Microsystems", Proceedings of the IEEE, vol. 96, No. 7, Jul. 2008, 19 pages.

Mei Zhang et al., "Strong, Transparent, Multifunctional, Carbon Nanotube Sheets", Science, www.sciencemag.org, Research Articles, vol. 309 (Aug. 19, 2005) pp. 1215-1219.

* cited by examiner

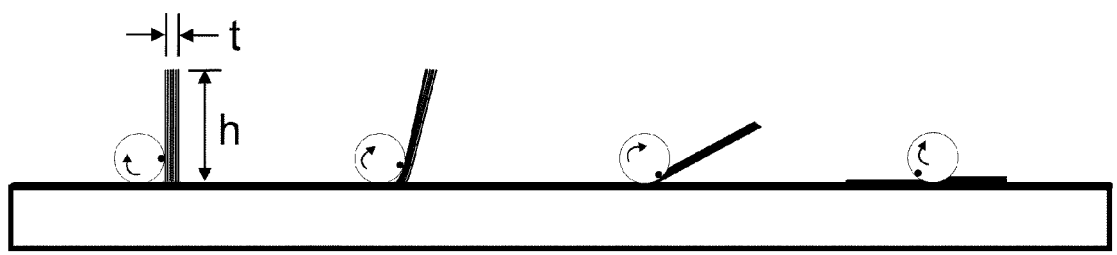
(a)
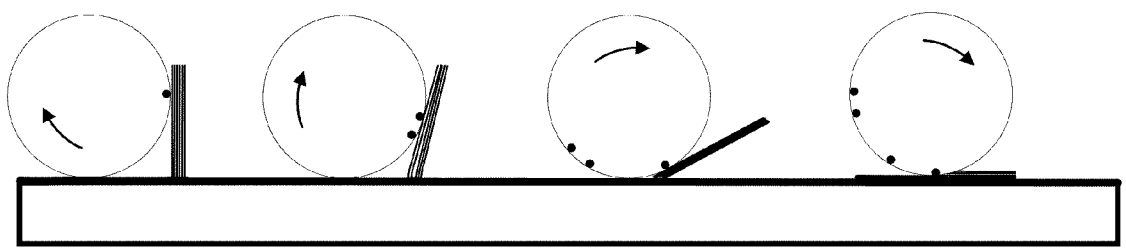
(b)
Figure 4
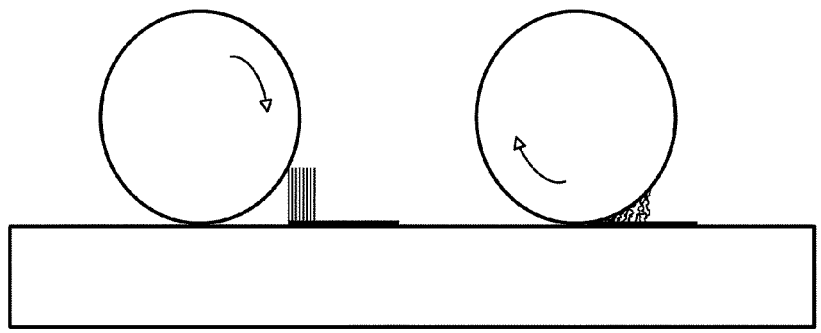
Figure 5
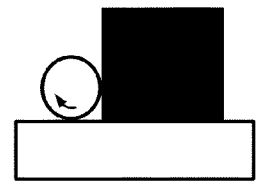
Figure 6

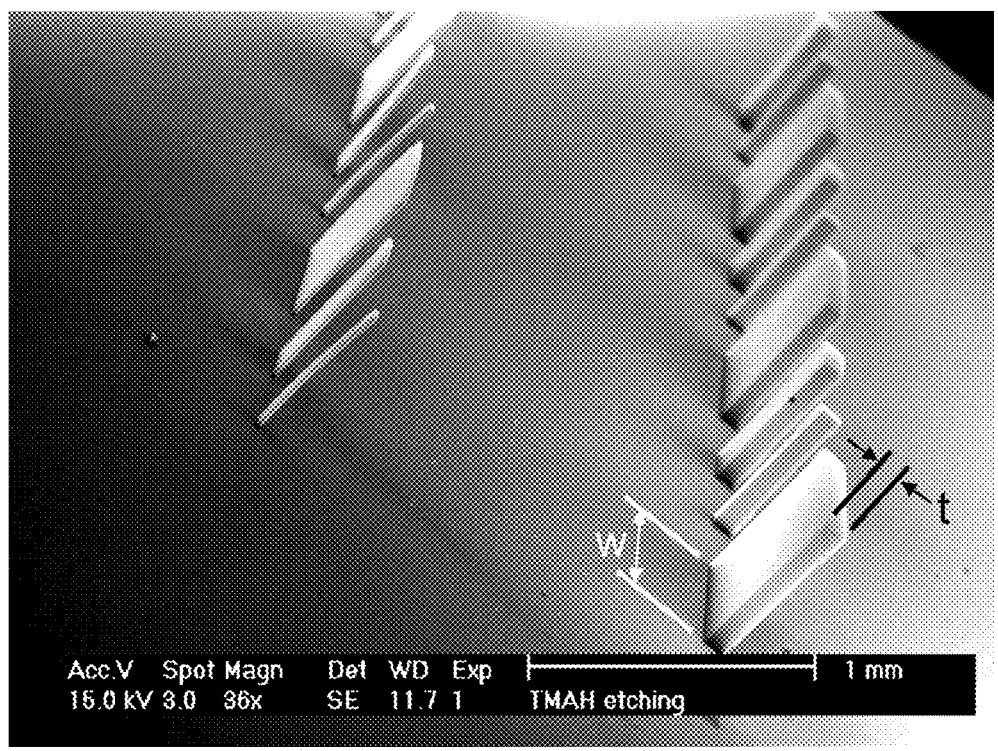
(a)
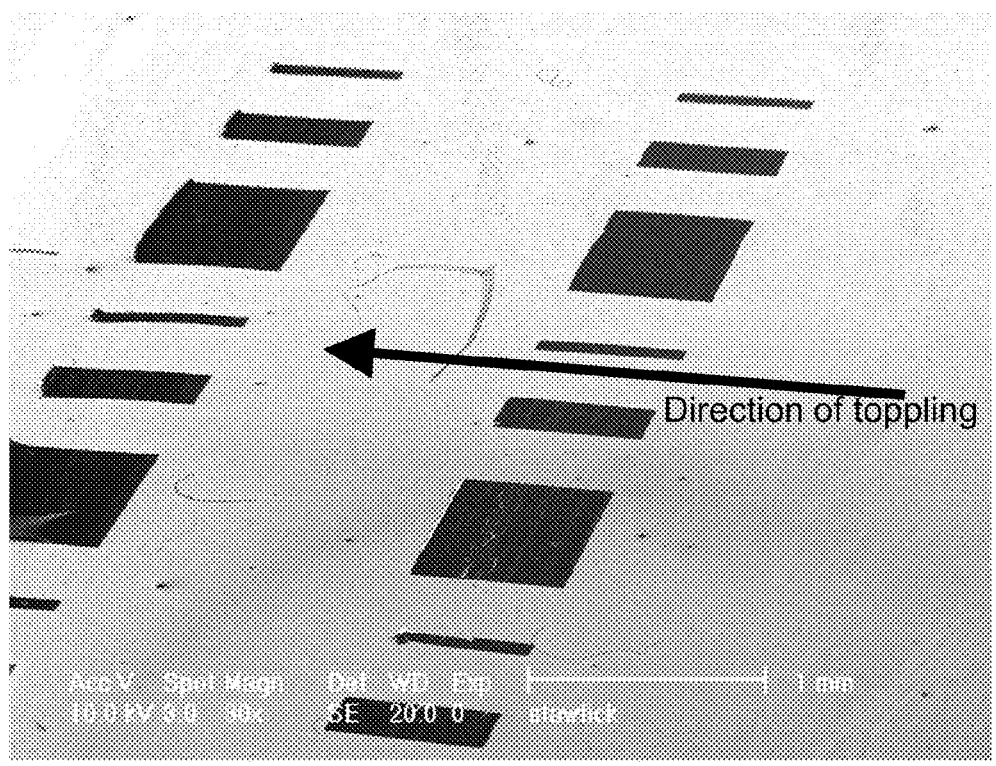
(b)
Figure 8

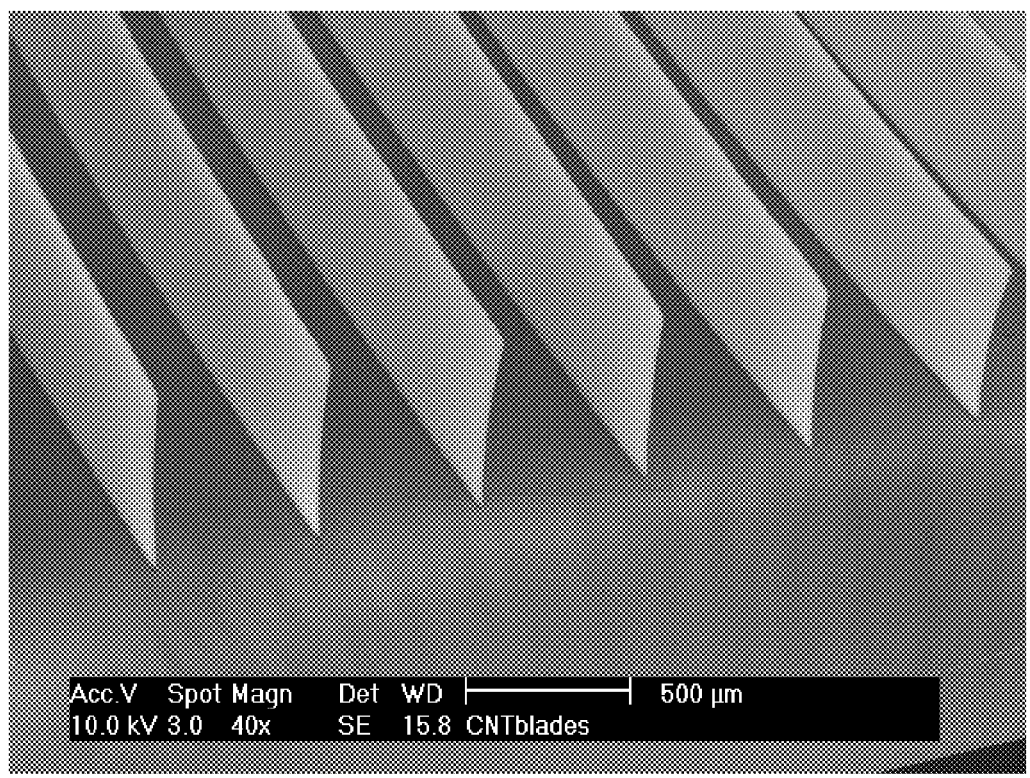
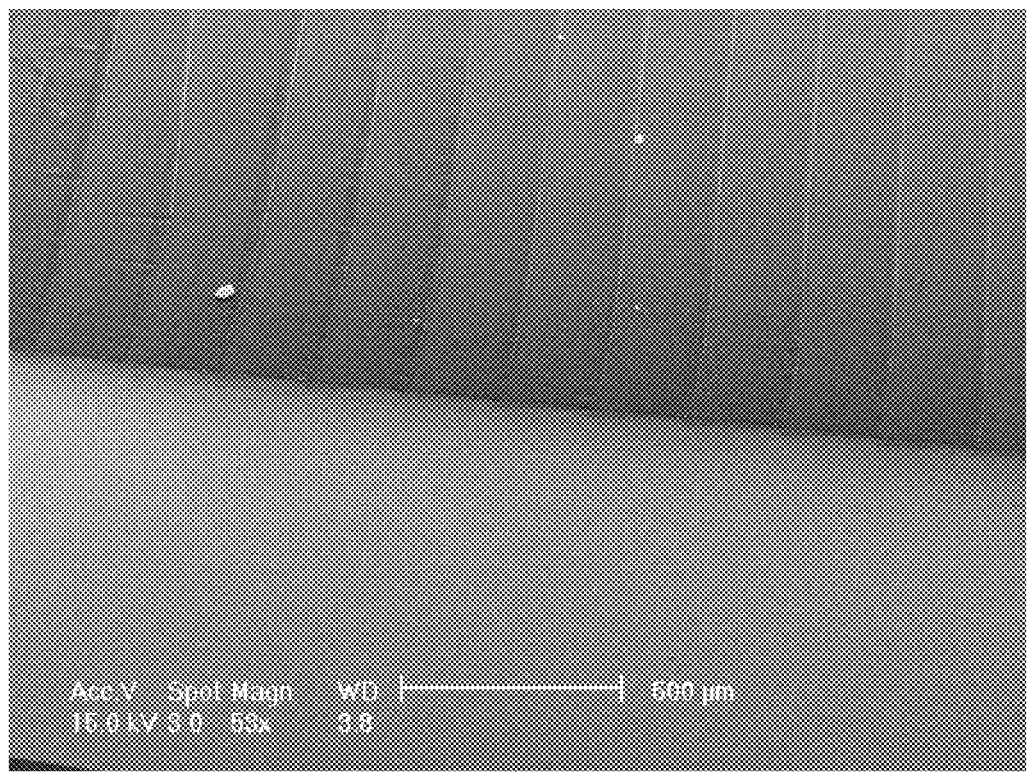
Figure 9

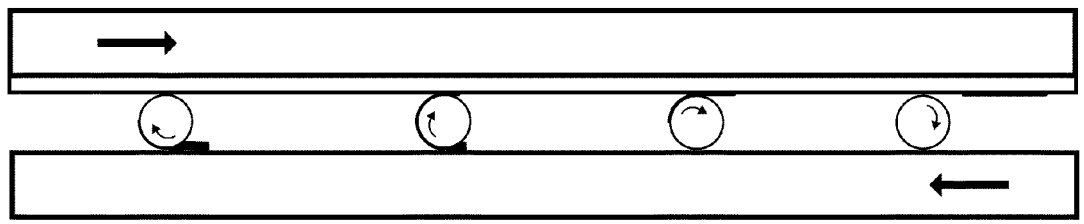
Figure 11
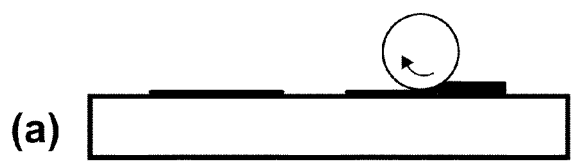
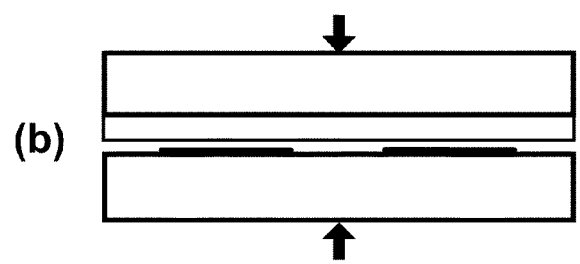
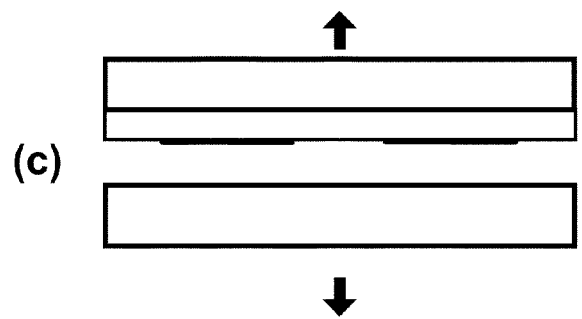
Figure 12

(a) 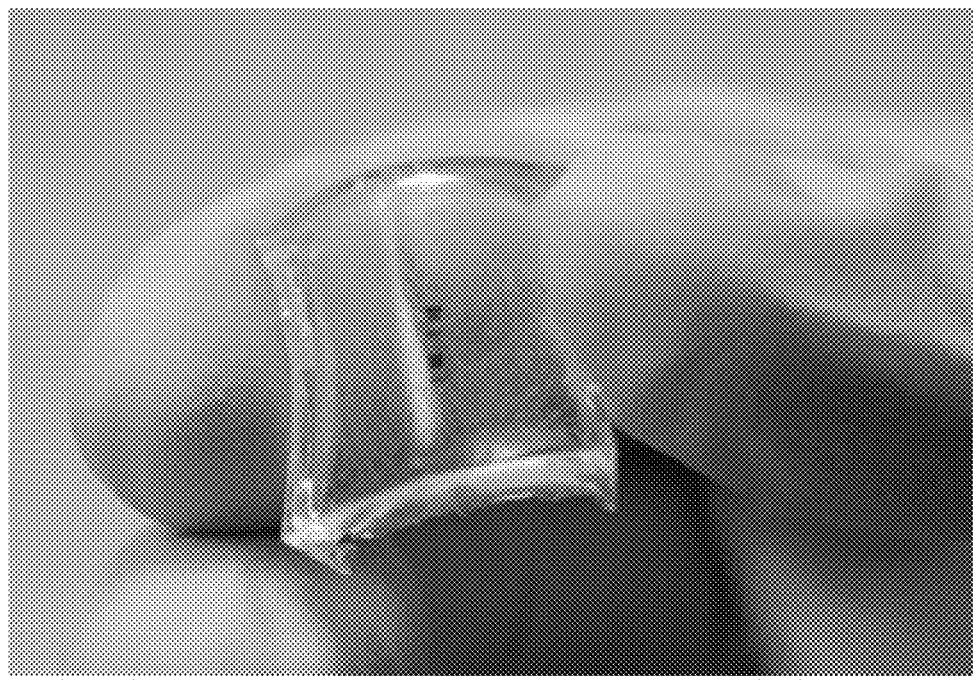
(b) 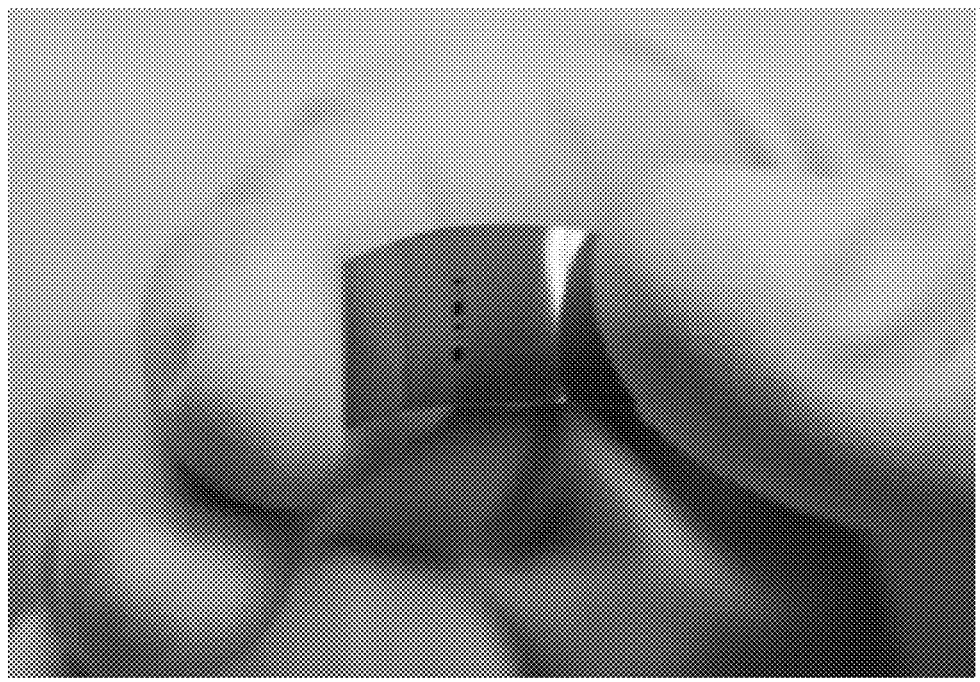
Figure 13

TRANSFORMATION OF NANOSTRUCTURE ARRAYS

CROSS-REFERENCE TO RELATED APPLICATION

This application claims the benefit of U.S. Provisional Application No. 61/119,120, filed Dec. 2, 2008, the complete disclosure of which is hereby incorporated by reference.

TECHNICAL FIELD

This invention relates generally to nanostructure arrays and, in particular, to the processing of nanostructure arrays to improve their utility in electrical, mechanical, thermal, fluidic, and other applications.

BACKGROUND OF THE INVENTION

Studies have shown that at least one type of nanostructure, carbon nanotubes (CNTs), may be able to replace copper in both vertical and horizontal microelectronic interconnects (Naeemi and Meindl, *IEEE Trans. Electron Devices* 54(1): 26-37, 2007). In particular, it has been theoretically shown that for global interconnects, bundles of single-wall nanotubes (SWNTs) or multi-wall nanotubes (MWNTs) can potentially replace copper wires by allowing the use of smaller interconnect dimensions while keeping delay and crosstalk noise constant, thus increasing the bandwidth density of global interconnects.

In addition, while copper is prone to electromigration and boundary scattering at emerging linewidths of less than 100 nm, CNTs are resistant to electromigration, have μm electron mean free path, and can handle substantially higher current densities up to $10^9$ A/cm$^2$. Calculations have also shown that CNTs can decrease switching energy consumption, and GHz operation of a single large diameter multi-wall CNT (MWCNT) as a horizontal interconnect has been experimentally realized (Close et al., *Nano Lett.* 8(2):706-709, 2008).

However, various challenges can arise when applying CNTs in interconnect technology. Some of these challenges include: 1) providing for horizontal orientation of CNT bundles on a chip; 2) providing a high packing fraction or density of CNTs; 3) providing CNT growth conditions such as temperature, pressure, and gas composition that are compatible with CMOS processing over wafer-scale areas; and 4) providing low contact resistance by assuring contact to all graphene shells (walls) of all tubes. Further, as key performance parameters (such as mean free path, number of conduction channels, etc.) depend on CNT length and diameter, a fabrication strategy would preferably facilitate tunability of CNT diameter as well as build interconnects from continuous parallel CNTs.

Researchers have sought to fabricate horizontally-aligned CNTs by direct growth on substrates (e.g., alignment by crystallographic interactions or gas flows), possibly followed by transfer printing. But sufficiently high CNT densities have not been achieved using these methods, and multi-layer approaches such as repeated transfer printing of single layers of CNTs require an impractical number of steps.

One method of attempting to obtain high density horizontally-aligned CNTs is capillarity-driven densification by controlled dipping of patterned sections of vertically-aligned CNTs (VA-CNTs) in solvents such as IPA or acetone (Hayamizu et al., *Nature Nanotechnology* 3:289-294, 2008). By engineering the catalyst and the dipping/drawing motion, "CNT wafers" consisting of horizontally aligned overlapping arrays of CNTs have been manufactured and used in device fabrication. The density that can be achieved using this method is limited by the zipping force of the solvent that results from the liquid surface tension and the contact angle between the solvent used and the CNTs.

Another method includes obtaining a CNT film from a "CNT carpet" by shearing the top of VA-CNT arrays, using a thin sheet of foil to lay the arrays down without disturbing their alignment, and compressing the CNT film covered by the foil using a roller. Finally, the CNT film may be detached from the foil and the growth substrate and transferred to different materials host substrates using a dry peel and place method (Pint et al., *ACS Nano* 2(9):1871-1878, 2008).

Another method includes manufacturing "CNT papers" by pushing a microporous membrane against a CNT forest by means of a cylinder having diameter much larger than the CNT forest height. The effect of the rolling motion of the cylinder on the CNT forest is compared to dominos pushing one another over where it is hypothesized that CNTs are sliding on each other to achieve the final aligned CNT film structure. The porous membrane (with the CNTs sticking to it) is peeled off of the growth substrate and ethanol is spread on the membrane to release the CNT paper (Wang et al., *Nanotechnology* 19:1-6, 2008).

Rolling out of vertical CNTs using a large diameter roller to obtain horizontally aligned CNT structures is also disclosed in U.S. Pat. No. 7,514,116 B2.

SUMMARY OF THE INVENTION

In accordance with one aspect of the invention, there is provided a method of densifying a nanostructure array. The method includes the steps of providing a nanostructure device that includes a substrate having a planar surface and an array of aligned nanostructures extending away from the substrate, placing a contact element adjacent the substrate such that the contact element has a central axis oriented parallel to the substrate surface, and moving the contact element such that it initially contacts at least some of the nanostructures at a location below a distal end of the nanostructures and re-orients the nanostructures into at least partial alignment with the substrate surface.

In accordance with another aspect of the invention there is provided an apparatus for densifying a nanostructure array. The apparatus includes a base for supporting a nanostructure device having a substrate and an array of aligned nanostructures extending away from the substrate, a contact element for moving over the surface of the substrate, and a loading mechanism operatively connected to the contact element for applying a load to the contact element to force it towards the substrate, wherein the contact element is configured to have a first contact point with the nanostructures that is above the substrate and below a vertical midpoint of the nanostructures.

BRIEF DESCRIPTION OF THE DRAWINGS

Preferred exemplary embodiments of the invention will hereinafter be described in conjunction with the appended drawings, wherein like designations denote like elements, and wherein:

FIGS. 4-7 illustrate geometric relationships between the roller size and the height of the nanostructure arrays, and relative motion at the contact point between the roller and the surface of the nanostructure arrays.

FIG. 8 illustrates a series of nanostructure arrays on a growth substrate before and after processing according to one aspect of the invention;

FIG. 9 shows rows of nanostructure arrays used to form a sheet by rolling the nanostructures such that the rows overlap to form a sheet;

FIG. 11 illustrates an exemplary method of transferring nanostructures to a second substrate;

FIG. 12 shows a second exemplary method of transferring nanostructures to a second substrate;

FIG. 13 shows photographs of densified nanostructure arrays transferred to polymide and Kapton tape;

DETAILED DESCRIPTION OF THE PREFERRED EMBODIMENTS

Nanostructures of the type contemplated herein are structures having at least two dimensions in the nanoscale; for example, elongate structures having a diameter or plural cross-sectional dimensions within the general range of 0.1 to 100 nanometers. This includes, for example, nanotubes, nanowires, nanorods, nanocolumns, and nanofibers. A nanostructure array comprises a plurality of nanostructures having their elongate dimensions generally aligned with one another or in the same general direction. For example, a vertically-aligned nanostructure array comprises a plurality of nanostructures generally aligned in a direction perpendicular to a growth substrate. The height of the nanostructure array can be in the nanoscale range, or can be larger; for example, in the micron or millimeter range. Among the many types of nanotubes and nanowires, choice of materials for a nanostructure array is subject to a number of considerations and constraints, including suitability of the materials for the desired application and compatibility of the nanostructures and related processing conditions (e.g., temperature, catalyst, precursors) with the fabrication process for the surrounding device. A nanostructure array can comprise nanostructures formed from one material, or can comprise nanostructures formed from two or more materials to create hybrid arrays. Similarly a nanostructure array can comprise various nanostructures such as single-wall nanotubes, multi-wall nanotubes, and nanowires, all in the same array.

Figure 1:
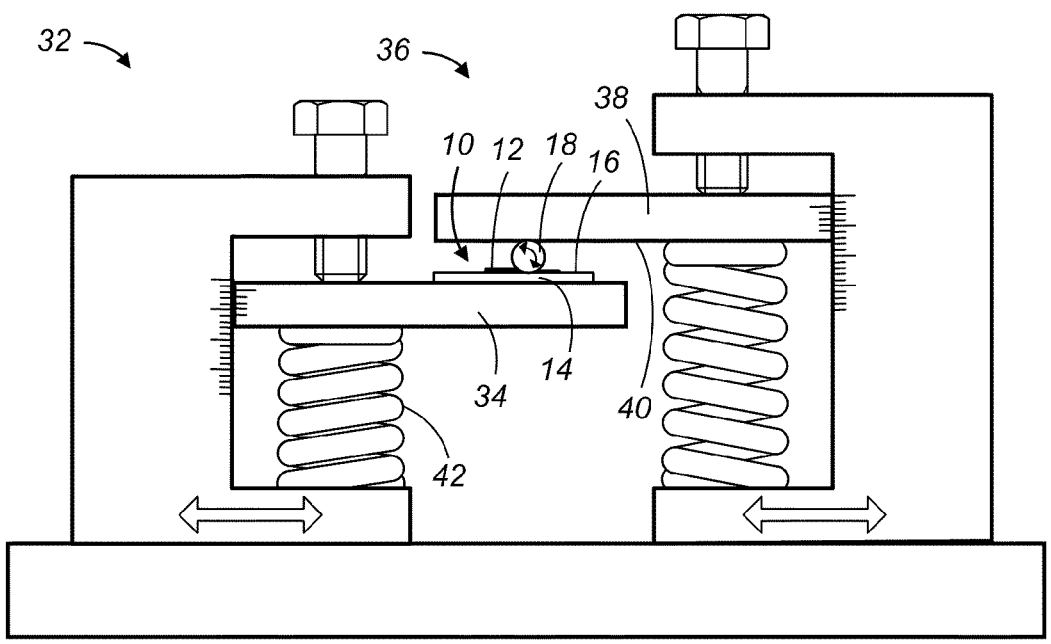
FIG. 1 illustrates an exemplary nanostructure array transforming and densifying apparatus according to one aspect of the invention.

FIG. 1 depicts a side view of an exemplary embodiment of a nanostructure array densifying apparatus 32 as it might be used for densifying a nanostructure device 10 that includes one or more arrays 12 of aligned nanostructures extending away from the upper, planar surface of a substrate 14. As shown in FIG. 1, the apparatus 32 includes a base 34 for supporting the nanostructure substrate 14, a contact element such as a roller 18 for contacting the nanostructures 12, and a loading mechanism 36 for applying a load to the roller 18. In general, the method used in this embodiment includes placing roller 18 adjacent the substrate 14 such that the roller has its central axis oriented parallel to the substrate surface, and then moving the roller such that it directly contacts at least some of the nanostructures and re-orients the nanostructures into at least partial alignment with the substrate surface. The roller 18 illustrated in this embodiment is generally cylindrical or round in cross-section and can be moved along the substrate 14 so that it directly engages and topples the nanostructure arrays 12. The movement along the substrate 14 can be a rolling movement (shown best in FIGS. 2 and 3), such that the roller 18 rotates about a central axis and comes into contact with the nano structures. The roller 18 directly contacts the nanostructures and is configured to have a first contact point 28 (shown best in FIG. 2) with the nanostructure array 12 that is above the substrate 14 and below a vertical midpoint 30 of the array 12 that is to be densified.

When using roller 18, two limiting geometric cases relating the roller size to the dimensions of the nanostructure array should be considered. In the first case, shown in FIG. 4a, the roller can have a diameter smaller than the height of the array. For example, a roller diameter of 0.6 mm is generally suitable for processing nanostructures having height greater than 0.7 mm, or preferably greater than 1.0 mm. In this case, the surface of roller may or may not slip relative to the surface of the nanostructure array, when the roller and the array are in contact. In the second case, shown in FIG. 4b, the roller can have a diameter equal to or greater than the height of the array. In this case, the surface of the roller will slip relative to the surface of the nanostructure array, when the roller and the array are in contact. In both cases, the thickness t of the nanostructure array is preferably much less than the height h of the nanostructure array.

Figure 7:
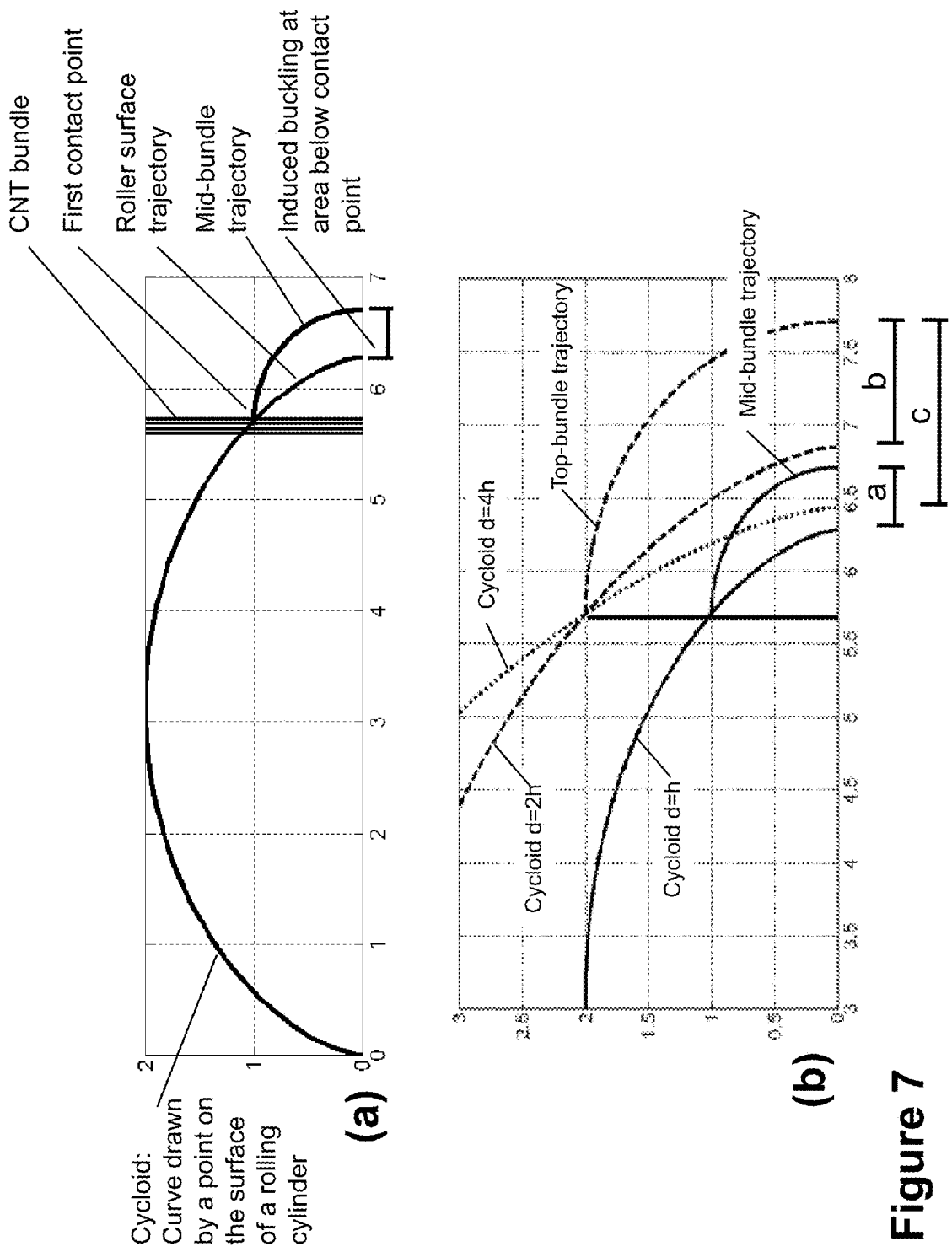

The relative roller and nanostructure array dimensional relationships noted above are useful where it is desirable to maintain the relative orientation of the individual nanostructures (e.g., so that after densification they continue to extend generally linearly and in parallel with respect to each other). By initially contacting the nanostructure array at a location that is below the distal (free) end of the individual nanostructures, and by preventing adhesion of the nanostructures to the roller 18 or other contact element, the array can be toppled in a controlled manner that substantially maintains the relative orientation of the individual structures. This can help increase the packing factor (discussed below) which can impart beneficial properties to the densified array. The result of undesirable adhesion can be understood by reference to FIGS. 5-7. For arrays of carbon nanotubes (CNTs), there is a tendency of the CNTs to stick to the roller as soon as they come in contact with it. This creates shear in the CNT arrays and results in the formation of buckles in the otherwise resulting horizontally aligned nanostructures. This is shown diagrammatically in FIG. 5. Moreover, due to the inherent lateral entanglement in CNT arrays resulting from the synthesis process, the slip between individual CNTs within the array is minimal. Therefore, if the thickness t of the array is substantially large enough (for example, as shown in FIG. 6), the same shear and buckling deformation occur resulting in high defects in the resulting horizontally aligned CNTs.

The trajectory taken by a point on the roller surface during rolling is represented in FIG. 7a by the cycloid curve. At contact, the CNTs stick to the roller and the point of contact takes the cycloid trajectory thus creating shear and deformation in the part of the nanostructure array below that point. The deformation length is estimated to be the difference between the cycloid trajectory and a circular trajectory having the bottom of the CNTs as the circle center. The larger the deformation length, the lower the quality of the horizontally-aligned array. As shown in FIG. 7b, when the roller diameter (d) is larger than twice the CNT array height (h), the top of the array will stick to the roller as they get in contact, resulting in that point taking the cycloid trajectory (d=2 h) shown above. The entire length of the array is subject to deformation and the deformation length is shown above as length (b). Note that (b) is larger than (a) corresponding to roller diameter equal to array height (d=h). Moreover, as the diameter of the roller get larger the deformation is larger thus inducing more defects in the array as depicted by trajectory (d=4 h) and the corresponding deformation length c. Thus, as described above, this problem with adhesion of the individual nanostructures to the roller 18 can be reduced or avoided in various ways, such as by minimizing the roller diameter or by creating slip between the roller and nanostructures. Slip can be enhanced by, for example, proper selection of the roller surface material, by maintaining a small diameter roller, by relative rotation (forward or backspin) of the roller, or by any combination of these or by any other suitable means. As another example, a small diameter roller can be used for which the rotation and translation are independently controllable, thereby permitting more precise control of slipping between the roller and nanostructure array.

An advantage of using a small roller diameter can be further understood by consideration of the van der Waals forces between the CNTs and roller. Since the resultant force from the van der Waals attraction between the CNTs and roller is directly proportional to the contact area, it is desirable to minimize the local contact area between the CNTs and the roller. From Hertzian contact mechanics, the width of the contact area between a cylinder (diameter d, length l, modulus $E_1$, poisson's ratio $v_1$) and a plane ($E_2$, $v_2$), is $$b = \left[\frac{2Fd}{\pi l}\left(\frac{1-v_1^2}{E_1} + \frac{1-v_2^2}{E_2}\right)\right]^{1/2} \quad (1)$$

Therefore, a small diameter roller made of a material having high elastic modulus gives relatively weak adhesion to the CNTs. This simple formula agrees with observations made that the CNTs tend to stick to rollers having a substantially larger diameter than described above, and/or to rollers made of a soft material (e.g., PDMS or Nylon).

Apart from a rolling movement using roller 18, transformation of the array (e.g., toppling) and densification can be carried out in other ways. For example, a different contact element can be used that does not involve rotation of the element as it is moved across the substrate. Thus, it will be appreciated that toppling can be carried out using only translation of the contact element relative to the arrays 12 such as by drawing a wire across the array. It is also contemplated that a non-cylindrical contact element may be moved in translation to topple and densify a nanostructure array. For example, the contact element may have a teardrop cross-section having a radius on a leading edge with a flat bottom. Various shapes are possible and can be used to vary the densification of the array, the load distribution on the array during densification, the adhesion of the nanostructures to the contact element, and the localized stresses on the nanostructures, among other things.

Referring back to FIG. 1, the loading mechanism 36 depicted in the exemplary embodiment includes an upper plate 38 having a surface 40 that contacts roller 18. The upper plate 38 is generally parallel to the base 34. The upper plate 38 and the base 34 are movable in relation to one another in a direction parallel to the base 34 or the surface 40, shown horizontal in FIG. 1. The base 34 and the upper plate 38 are also movable in relation to one another in a direction perpendicular to the base 34 or the surface 40 to accommodate various size rollers 18 and to facilitate application of a load on the roller 18. The loading mechanism 36 may also include a load applicator 42. The load applicator 42 in FIG. 1 is a spring that acts on the base 34 to apply a load to the roller 18 in a direction perpendicular to the surface 40. Though shown as a spring here, other load applicators 42 are possible, such as one or more pneumatic or hydraulic cylinders, servo motor devices, power screws, or other devices. The load applicator 42 may alternatively act on the upper plate 38 or additional load applicators may be used to act on both the upper plate 38 and the base 34. The load applied by the load applicator 42 can be variable. Varying the compression of the spring 42 with an adjustment screw as shown in FIG. 1 is one way of varying the load, but other methods and devices are possible.

Where upper plate 38 is included as a part of apparatus 32, it may also include a cutout having a width greater than or equal to a width of the nanostructure substrate 14 to allow the nanostructure array 12 to extend past a plane defined by the surface 40. The cutout can allow clearance for the nanostructure array 12 so that the upper plate 38 does not contact the array 12. An example of such a cutout is best shown in FIG. 3.

Loading mechanisms 36 other than those shown in FIG. 1 are contemplated. For example, the roller 18 may have an axle extending through its central axis and the load could be applied to the axle from above or from below without contacting the outer surface of the roller. Many other loading mechanisms 36 are possible.

Figure 2:
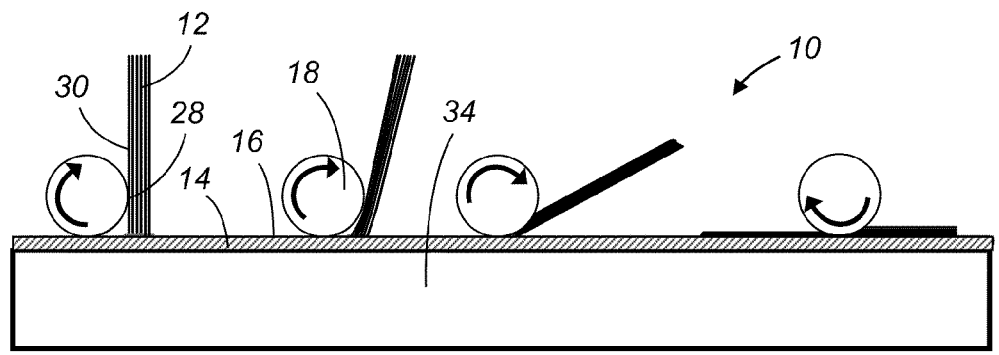
FIGS. 2-3 illustrate an exemplary method of transforming and densifying nanostructure arrays according to one aspect of the invention.
Figure 3:
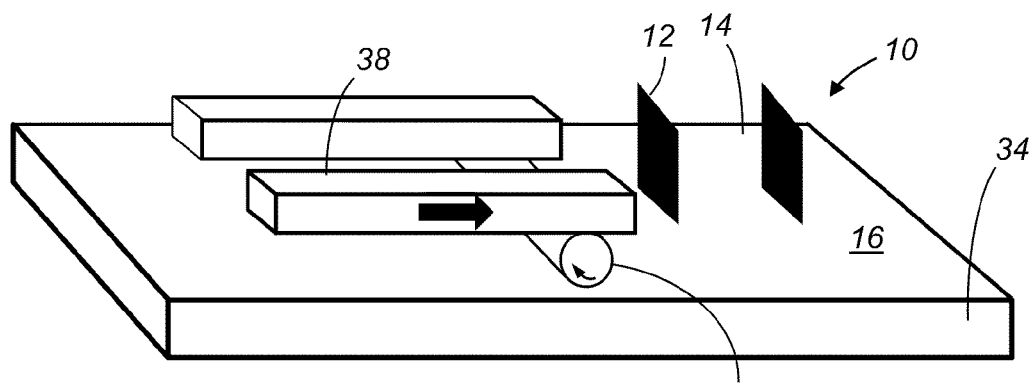

FIGS. 2 and 3 depict an exemplary embodiment of a method of processing nanostructure arrays in accordance with the invention. The method may include one or more steps in addition to those described here. The method includes providing an array 12 or multiple arrays of vertically aligned nanostructures on a substrate surface 16, providing a roller 18 having a central axis, placing the roller 18 on or in proximity to the substrate surface 16 such that the central axis is substantially parallel to the substrate surface 16, moving the roller 18 with reference to the substrate surface 16 such that it directly contacts at least some of the nanostructures and topples the array and aligns at least a portion of the nanostructures with the substrate surface 16. After toppling the nanostructures, continued contact between the roller and nanostructures densifies the nanostructures, while the densified nanostructure array is in contact with both the roller and the substrate surface. In this example, the roller 18 used in this exemplary method can be constructed according to the exemplary apparatus 32 already described and has a diameter less than a height of the array and a first contact point 28 with the nanostructures that is above substrate surface 16 and below a midpoint 30 of the nanostructures. In this embodiment, the central axis of the roller 18 is substantially parallel to a width of the array 12 and perpendicular to a thickness of the array 12. The width w and thickness t are best shown in FIG. 8*a*. The axis of the roller 18 need not be parallel with the width dimension of the array. Some arrays may not have discernable widths and thicknesses or may have irregular cross-sections.

As shown in FIGS. 2-4, the process can be carried out using nanostructure arrays 12 in which the thickness t of the array is less than the height of the array above the substrate. Preferably, this is done using arrays 12 in which the ratio of the thickness to height is less than 0.1. Also, the substrate can include a plurality of such arrays 12 in which the spacing between arrays (in the direction of motion of the roller or other contact element) is less than the height of the arrays in which case the adjacent arrays of nanostructures may overlie each other to some extent after toppling. An example is shown in FIG. 9 wherein wide strips of small thickness nanostructure arrays (FIG. 9*a*) are toppled to form a sheet of overlapping strips (FIG. 9*b*). Alternatively, the substrate can have some or all of its arrays 12 with spacing between adjacent arrays greater than or equal to the height of the arrays so that no overlap occurs.

Figure 10:
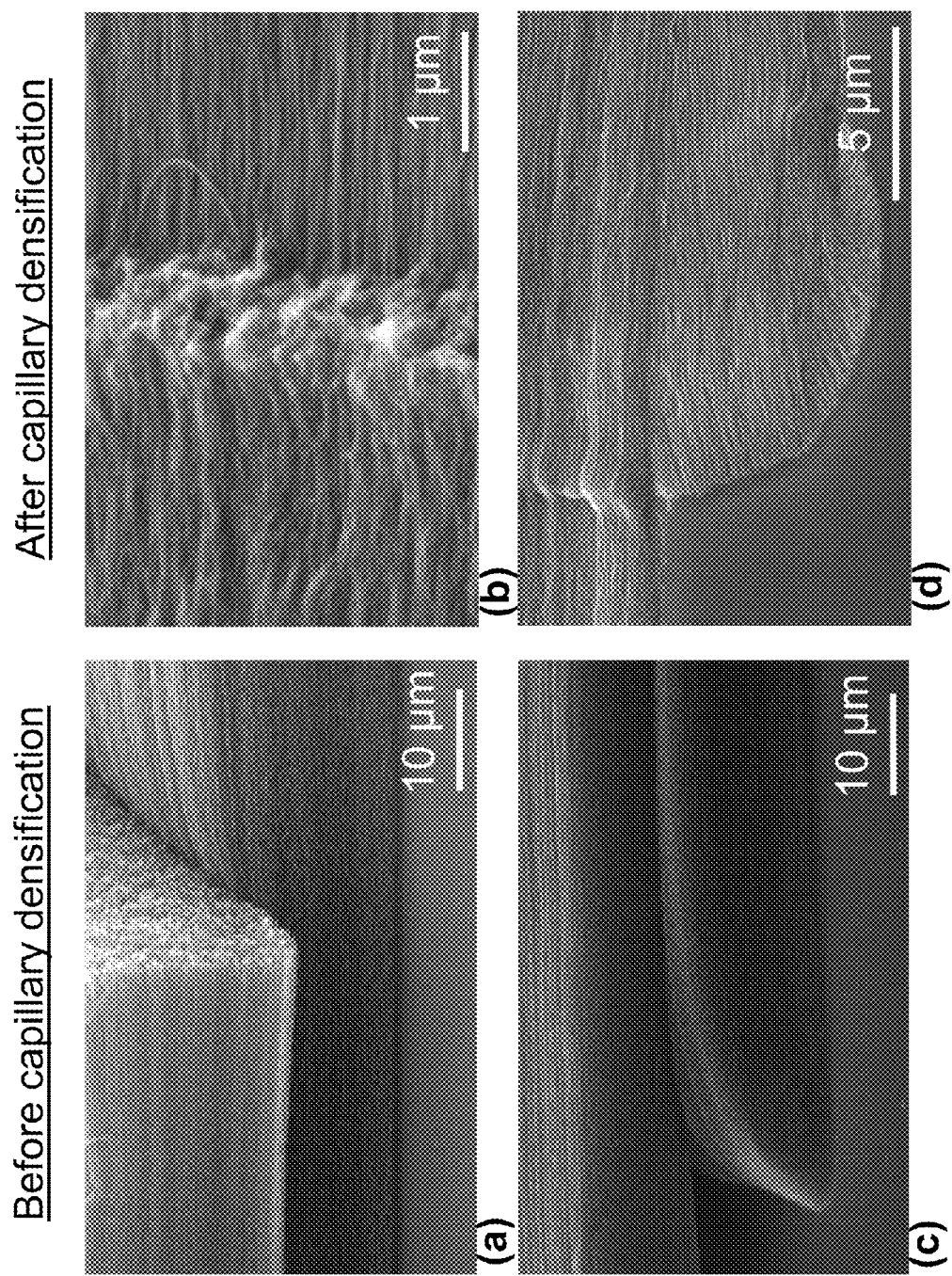
FIG. 10 shows the result of capillary densification following mechanical rolling of the rows of nanostructures from FIG. 9.

When overlapping lines of nanostructures as shown in FIG. 9, the overlapped portions are not fully merged together after mechanical rolling. This can be seen in FIG. 10*a* which shows the distal (free) end of one array lying on top of another array, as well as in FIG. 10*c* which shows one array lying over the proximal (attached) end of another array. After using liquid capillary forces the overlapping carbon nanotube bundles densify and merge together creating interpenetrating bundles. This is shown in FIGS. 10*b* and 10*d* which depict the areas shown in FIGS. 10*a* and 10*c*, respectively, after densification using capillary forces. To achieve the capillary densification shown, the toppled arrays are infiltrated with an organic solvent such as isopropanol or acetone, such as by condensation of a solvent vapor onto the substrate. The solvent is then subsequently evaporated. This evaporation of the solvent draws the CNTs into a more tightly packed arrangement. The final packing fraction depends on the initial spacing (packing fraction) of the CNTs after the rolling process. Therefore, maximal packing of CNTs is achieved by combining mechanical and capillary densification methods.

The array 12 can have a first thickness prior to moving the roller 18 and a second thickness after the roller 18 topples the array 12, wherein the second thickness is less than the first thickness. The array 12 can also define a first cross-sectional area prior to moving the roller 18 and a second cross-sectional area after the roller 18 topples the array 12, wherein the second cross-sectional area is less than the first cross-sectional area. These dimensional changes are indicative of the densification of the array, where the individual nanostructures within the array are forced closer to one another. The amount of densification can be controlled by the magnitude of the load applied to the roller 18, as will be described in further detail. The forces applied to the roller, and the trajectory of the roller, can be varied continuously during the process.

By controlling the adhesion of the nanostructures to the growth substrate and to the roller, the nanostructures can adhere to the growth substrate or to the surface of the roller. Therefore, the nanostructures can remain on the growth substrate after the process is complete, as in the embodiments above, or can be transferred to a second substrate, as shown in FIG. 11, where the nanostructures adhere to the surface of the roller, and then are released upon contact with a second substrate. Strong adhesion between the individual CNTs and the substrate is created by rapid cooling in the reaction atmosphere, so as to form a carbide interface between the nanostructures and catalyst particles. Alternatively, when He flow is used during the cooling step, the CNTs are easily delaminated from the substrate because the adhesion strength between the CNTs and roller exceeds the strength between the CNTs and the substrate. Strong adhesion is useful when the CNTs remain on the growth substrate, whereas weak adhesion is useful when the CNTs are printed to a secondary substrate.

To carry out the transfer printing, the roller is placed between the growth substrate and the host (transfer substrate). This facilitates transformation, densification, and transfer of the nanostructures to the host substrate, which can be another silicon wafer, metal foil, or polymer such as Kapton or PDMS (polydimethylsiloxane). Elastomeric substrates can also be used as the transfer substrate. The contact force between the roller and the host substrate, and the surface properties of the roller and the host substrate can be controlled to facilitate detachment of the nanostructures from the roller upon contact with the host substrate. In another embodiment, the nanostructure arrays can be rolled and transferred to a roller, and then subsequently transferred from the roller to another substrate as a secondary operation.

FIG. 12 depicts yet another means of transfer printing. In it, the CNT arrays can be rolled to form horizontally aligned arrays on the growth substrate. Subsequently, the arrays can be transferred without the need of a roller to an arbitrary substrate by controlling the carbon nanotube-growth substrate adhesion relative to the carbon nanotubes-receiving substrate adhesion. Again, this can be done, for example, by use of He flow during the cooling step of the CNT growth process. As one example of a transference process, the horizontally-aligned CNT arrays can be robustly transfer printed to substrates such as flexible films of PDMS and Polyimide (Kapton) as shown in FIGS. 13*a* and *b*, respectively. A smooth PDMS carrier substrate, made by curing and then delaminating the PDMS from a template silicon substrate, is laminated onto the original horizontally-aligned CNT substrate after rolling and capillary densification. Taking advantage of kinematically controlled adhesion of PDMS to $SiO_2$, the CNTs stick to the PDMS when the carrier substrate is peeled quickly from the growth substrate. By laminating the PDMS carrying the CNTs onto a polymide film and then peeling it off slowly the CNT arrays are uniformly transferred to polyimide as shown in FIG. 13. In contrast to previous PDMS transfer of crystallographically-aligned CNTs, the high packing density and uniform texture of our CNT arrays facilitates their direct printing without need to infiltrate the CNTs with a polymer as a carrier medium. Raman spectroscopy measurements again show no considerable change in the $I_G/I_D$ ratio, suggesting the printing process does not damage the CNTs.

Figure 14:
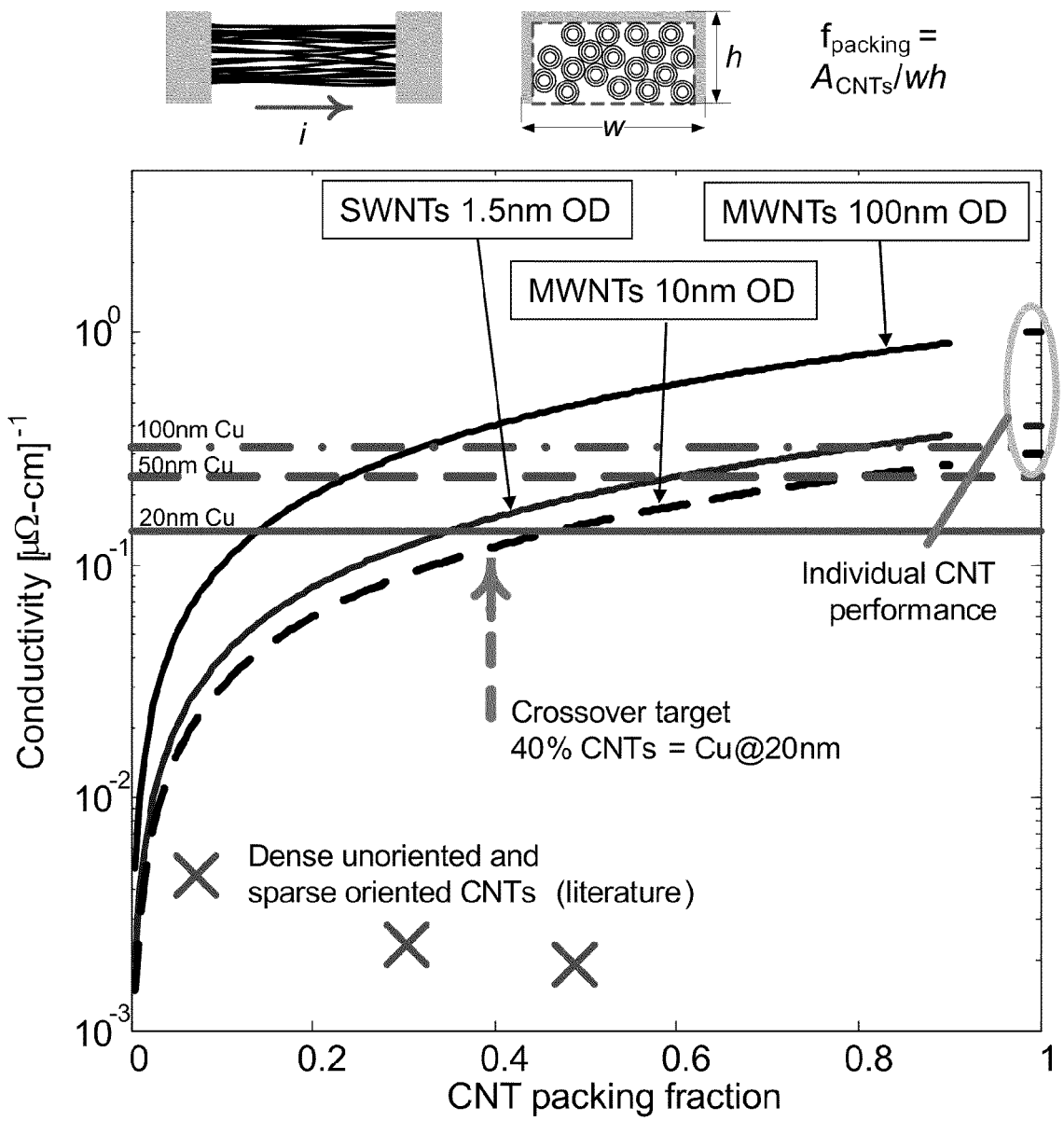
FIG. 14 illustrates the relationship between electrical conductivity and packing fraction for various configurations of CNTs, compared to copper.
Figure 15:
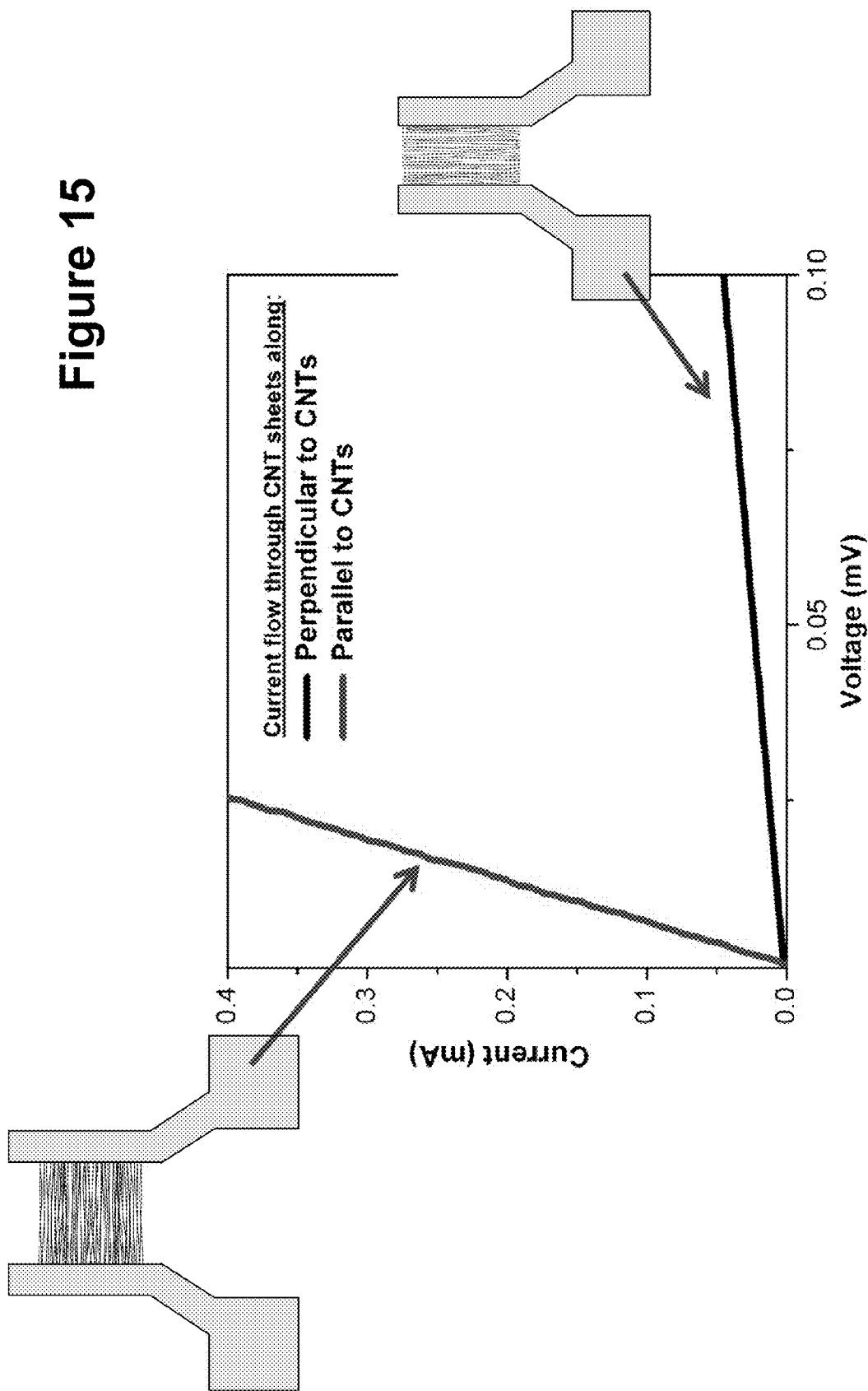
FIG. 15 depicts the anisotropic electrical conductivity of the nanostructure arrays processed according to the methods described herein.

FIG. 14 shows various determined electrical conductivities versus packing fraction for various individual CNTs, CNT bundles, and copper traces. Conductivity of the horizontally-aligned nanostructures described herein is anisotropic. This is shown in FIG. 15 wherein conductivity is substantially greater in the direction of the alignment of the CNTs than in a direction perpendicular to them. Differences in directional conductivity can be controlled so that, for example, a relative conductivity in the parallel direction can be at least ten times greater than the conductivity perpendicular to a nanotube direction. Or as another example, the parallel direction conductivity can be at least one hundred times greater than the perpendicular conductivity. Further conductivity properties exhibited by the nanostructure arrays processed according to the teachings herein are described in S. Tawfick et al., *Flexible High-Conductivity Carbon-Nanotube Interconnects Made by Rolling and Printing*, small 2009, 5, No. 21, 2467-2473 (2009), the complete contents of which are hereby incorporated by reference.

EXAMPLE

Arrays of densely packed, horizontally-aligned CNTs were manufactured by a method as disclosed herein. Lithographically patterned films of 1/10 nm Fe/Al$_2$O$_3$ were deposited by electron beam evaporation on a Si substrate. Arrays of vertically-aligned CNTs were grown by heating the substrate to 775 C in a 1" diameter quartz tube furnace, under a flow of 100/400 sccm He/H$_2$, followed by 100/400/100 sccm C$_2$H$_4$/H$_2$/He for 20 minutes.

An apparatus was built wherein a smooth stainless steel roller was placed between a parallel base and upper plate. Opposite motion of the base and upper plate caused the roller to rotate about a fixed virtual pivot. Growth substrates including various sizes of VA-CNT arrays were affixed to the base. When the substrates advanced, the roller first toppled the CNT arrays, then densified the CNT arrays using the contact stresses between the roller and the substrate. The applied force can determine the thickness of the densified arrays. Different patterns of catalyst were designed and fabricated to investigate the rolling mechanism and densification factor. The conservation of the CNT quality and alignment after densifying was characterized using Raman spectroscopy and SEM.

The steps used to obtain densified horizontal-aligned CNT arrays are as follows:

1. Patterned VA-CNT arrays were grown on Si—SiO$_2$ substrates, to a height of 1-2 millimeters, using thermal CVD as discussed previously.
2. The substrate with the VA-CNT arrays was affixed to the lower spring loaded base of the apparatus using a vacuum chuck.
3. The 0.6 mm diameter stainless steel roller was aligned parallel to the CNT arrays.
4. The upper plate, in the form of parallel rails defining a cutout in the plate, were moved down to contact and apply force to the substrate through the roller via the spring-loaded base until the desired compression force was reached.
5. The base and upper plate were moved simultaneously in directions opposite to one another such that friction caused the pin to roll in the direction of the VA-CNT arrays.

Various cross-sectional shapes of VA-arrays were studied using this densification method. The effect of different loads on the final dimensions of the arrays was also studied. As used here, the dimension perpendicular to the axis of the roller in the direction of rolling will be called the thickness, and the dimension parallel to the axis of the roller will be called the width. The rectangular dimensions of the original cross-sections of the arrays that were studied are as follows:

| Width (μm) | Thickness (μm) |
|---|---|
| 900 | 100 |
| 300 | 100 |
| 100 | 100 |
| 900 | 20 |
| 300 | 20 |
| 100 | 20 |

For each of these cross sections, three sets of normal forces were applied to the roller by adjusting the deflection of the spring loaded base, and the dimensional changes were measured from SEM micrographs.

Figure 16:
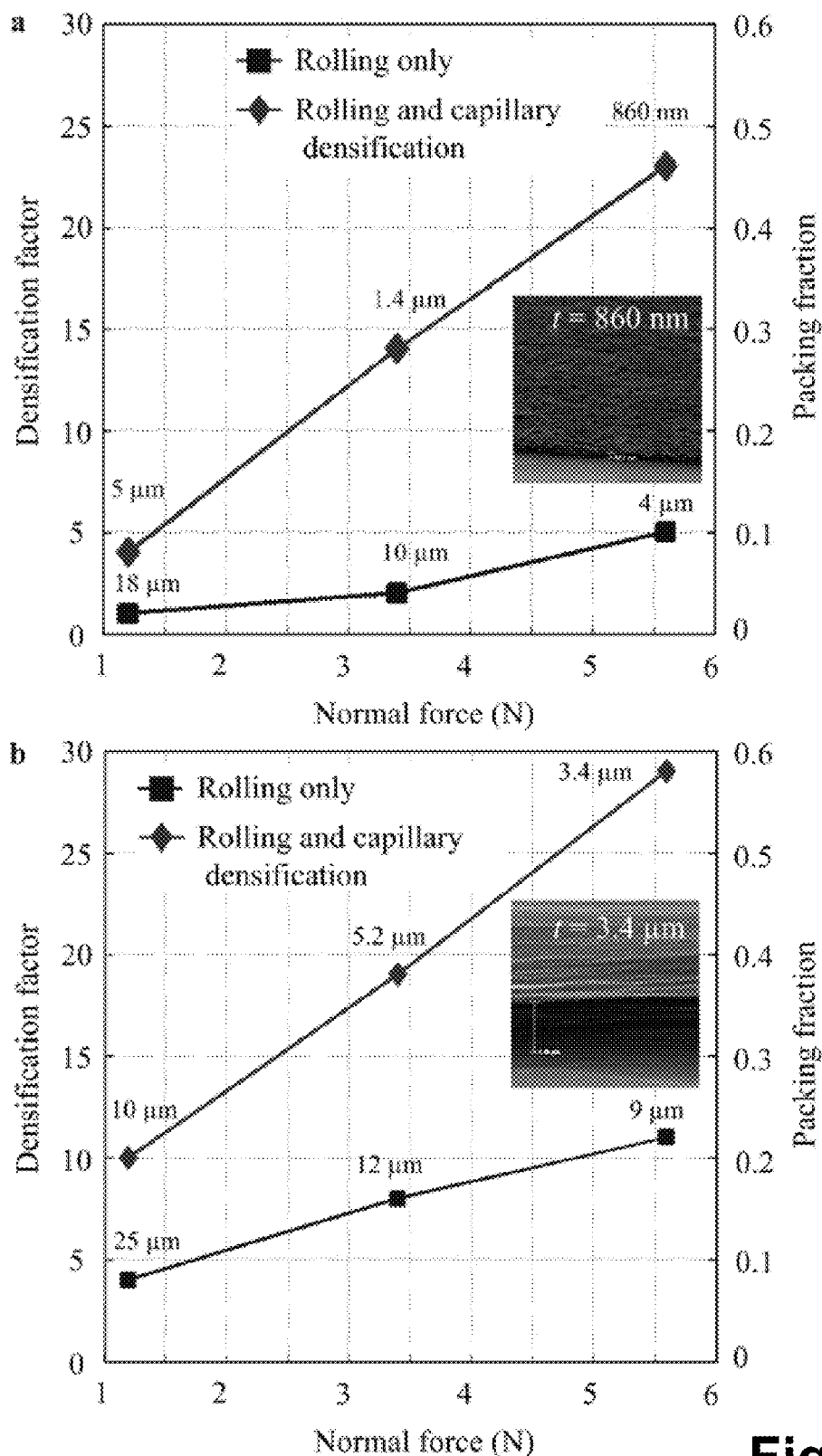
FIG. 16 depicts the relationships of densification factor, applied rolling force, and packing factor for different nanostructure arrays, both with and without subsequent capillary densification.

The width and the height of the CNT arrays did not substantially change. These dimensions are insensitive to the applied force. In fact, the change in thickness of an array can be regarded with great accuracy as the change in the total volume of the array, and hence the change in bulk density. Also, the decrease in the thickness of the array is approximately linear with the increase of the normal force, as shown for example in FIGS. 16a and 16b, until a limit governed by tight packing among the CNTs is reached. FIG. 16 plots the densification ratio (w/t) and packing fraction of horizontally-aligned CNT arrays created from vertically-aligned CNT blades—a 300 μm×20 μm array for FIG. 16a and a 300 μm×100 μm array for FIG. 16b. The densification factor is calculated by dividing the original thickness of the array by the final thickness of the array. This linear behavior may be due to the low packing fraction of the CNTs in the as-grown array. The average as-grown bulk density of the VA-CNT arrays were estimated to be 0.028 g/cm$^3$, which corresponds to 2.5×10$^{10}$ CNTs/cm$^2$ for the case of MWCNTs having an average of 10 nm outer diameters and 6 nm inner diameters. Thus, the packing fraction was approximately 2% for the as-grown arrays. The rolling and the subsequent densification resulted in CNT arrays with a 30× decrease in thickness which corresponds to a 60% packing fraction.

Figure 17:
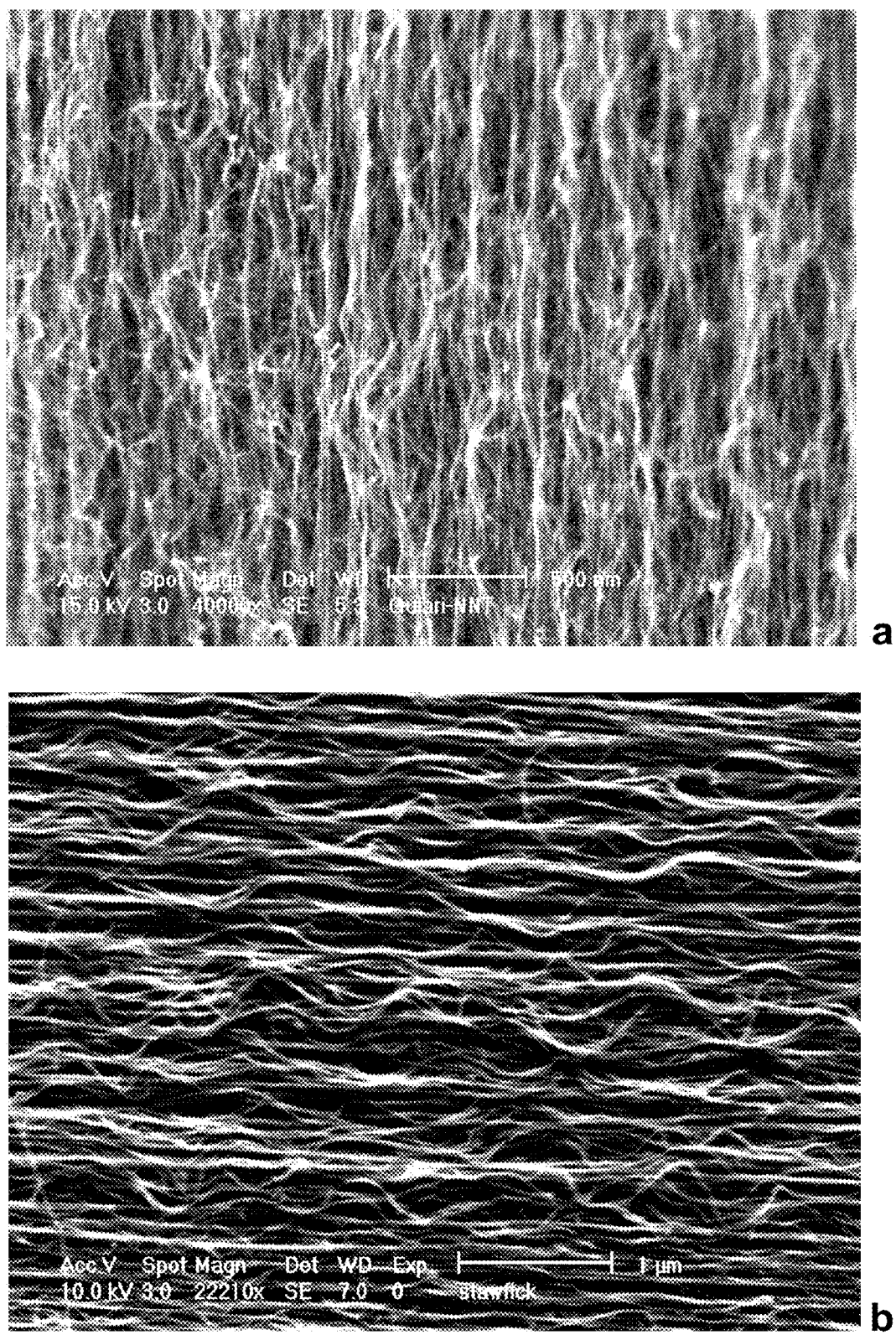
FIG. 17 illustrates SEM micrographs of nanostructure arrays before and after densification according to one aspect of the invention.

Raman spectra measured on the CNT arrays before and after densification and the G/D ratio showed that the quality of the resultant horizontally-aligned CNT arrays are preserved. FIGS. 17a and 17b illustrate the general vertical and horizontal alignment, respectively, of CNTs before and after densification according to the method described. Note that FIG. 17a is approximately twice the magnification of FIG. 17b. These images are indicative of the preservation of alignment before and after densification. Additional thickness measurements were taken and densification factors calculated after exposing densified arrays to acetone vapor. This additional step further increased the densification factors of the arrays, as shown in FIGS. 16a and 16b.

Figure 18:
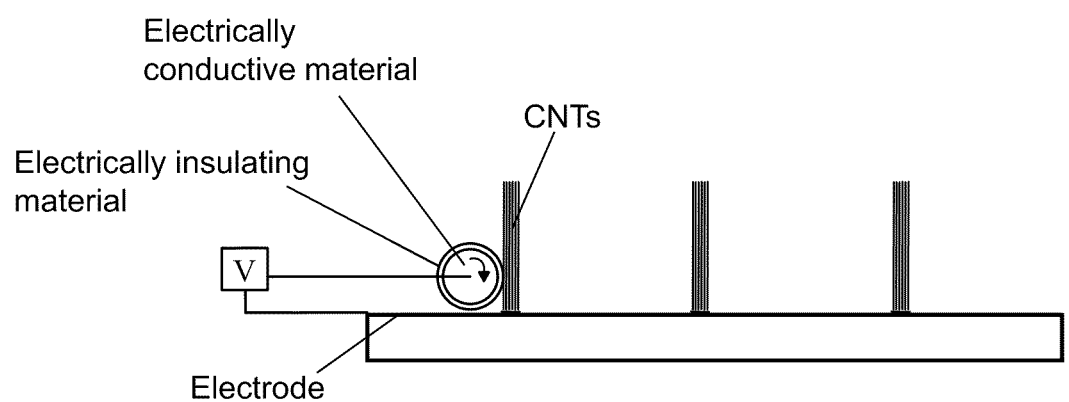
FIG. 18 depicts a method of using voltage to create electrostatic attraction or repulsion of nanostructures relative to a contact element used to transform and densify the array.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, in another embodiment, the adhesion between the CNTs and the roller (contact element) is controlled by applying a voltage between the contact element and the CNTs. This is shown in FIG. 18. In one example, a cylindrical roller is made from a metal and coated with a thin electrical insulating layer. A voltage is applied to both the metal core of the roller and the CNTs. If an equal voltage is applied to both the roller and CNTs, with respect to a common reference (ground), electrostatic repulsion between the roller and CNTs exerts an additional force between the roller and CNTs, promoting toppling and densification. If there is a voltage difference between the roller and CNTs, electrostatic attraction draws the CNTs toward the roller and increases the adhesion force. The voltage may be changed to achieve control of the adhesion and CNT-roller interaction during the process. Furthermore, other means such as a fluid flow can be used to topple and densify the nanostructure arrays, and all such other embodiments, changes, and modifications are intended to come within the scope of the appended claims.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method of densifying a nanostructure array, comprising the steps of:
   providing a nanostructure device that includes a substrate having a planar surface and an array of nanostructures each extending away from the substrate to a distal end located above the substrate; and
   moving a contact element relative to the array such that it the contact element initially contacts makes direct contact with at least some of the nanostructures at a location above the substrate surface and below the distal end of the nanostructures and re-orients the nanostructures into at least partial alignment with the substrate surface, wherein the nanostructures remain on the substrate during re-orientation and the contact element comprises a cylindrical roller, and wherein the moving step further comprises rolling the roller across the nanostructures while permitting slip where the roller contacts the nanostructures.

2. The method of claim 1, wherein the contact element is cylindrical and has a diameter less than a height of the nanostructure array.

3. The method of claim 1, wherein a first contact point of the contact element with the nanostructures is above the substrate surface and below a vertical midpoint of the nanostructures.

4. The method of claim 1, wherein the array has a width extending in a direction that is substantially parallel to a central axis of the contact element, and wherein the array width remains substantially constant during the moving step.

5. The method of claim 1, wherein the array has a first thickness prior to the moving step and a second thickness after the moving step, wherein the second thickness is less than 10% of the first thickness.

6. The method of claim 1, wherein the array has a first thickness prior to the moving step and a second thickness after the moving step, wherein the second thickness is less than 1% of the first thickness.

7. The method of claim 1, wherein, prior to the moving step, the thickness of the array is less than the height of the array.

8. The method of claim 7, wherein the ratio of the array thickness to height is less than 0.1.

9. The method of claim 1, wherein the substrate contains a plurality of nanostructure arrays with spacing greater than or equal to the height of the arrays.

10. The method of claim 1, wherein the substrate contains a plurality of nanostructure arrays with spacing less than the height of the arrays.

11. The method of claim 1, wherein the array defines a first cross-sectional area prior to the moving step and a second cross-sectional area after the moving step, wherein the second cross-sectional area is less than the first cross-sectional area.

12. The method of claim 1, wherein the nanostructures comprise single-wall or multi-wall nanotubes.

13. The method of claim 12, wherein the nanotubes are carbon nanotubes.

14. The method of claim 1, further comprising the step of applying a load to the contact element that forces it towards the substrate during the moving step.

15. The method of claim 1, further comprising the steps of detaching at least some the nanostructures from the substrate and transferring the detached nanostructures to a second substrate.

16. The method of claim 15, wherein the detaching step further comprises detaching at least some of the nanostructures via adhesion between the nanostructures and the contact element.

17. The method of claim 15, wherein the transferring step further comprises transferring the detached nanostructures via the contact element.

18. The method of claim 1, further comprising the step of densifying the re-oriented nanostructures via capillary attraction using a fluid.

19. The method of claim 1, wherein the providing step further comprises providing a plurality of nanostructure arrays spaced from each other by a distance that is less than a height of at least one of the arrays, and wherein the moving step further comprises moving the contact element such that the plurality of arrays overlap each other in contact with each other in a generally horizontal orientation.

20. The method of claim 19, further comprising the step of densifying the overlapped arrays via capillary attraction using a fluid.

21. The method of claim 1, wherein the moving step further comprises applying a voltage to at least one of said contact element and array.

22. The method of claim 1, wherein said providing step comprises growing the array on the substrate and wherein the method further comprises carrying out multiple iterations of the growing and moving steps wherein different iterations of the moving step involve contacting the grown arrays in different directions.

* * * * *